United States Patent [19]

Kosson et al.

[11] Patent Number: 4,958,093

[45] Date of Patent: Sep. 18, 1990

[54] VOLTAGE CLAMPING CIRCUITS WITH HIGH CURRENT CAPABILITY

[75] Inventors: Julie S. Kosson, Burlington, Vt.; Michael J. McLennan, Lafayette, Ind.

[73] Assignee: International Business Machines Corporation, Armonk, N.Y.

[21] Appl. No.: 356,917

[22] Filed: May 25, 1989

[51] Int. Cl.$^5$ .............................................. H03K 5/08
[52] U.S. Cl. ..................................... 307/540; 307/546; 307/548; 307/279; 307/290; 307/362
[58] Field of Search ............... 307/540, 546, 548, 579, 307/585, 279, 290, 362

[56] References Cited

U.S. PATENT DOCUMENTS

| | | | |
|---|---|---|---|
| 3,809,926 | 5/1974 | Young | 307/235 R |
| 4,024,418 | 5/1977 | Hankel | 307/304 |
| 4,251,739 | 2/1981 | Morozumi | 307/238 |
| 4,314,167 | 2/1982 | Groves et al. | 307/540 |
| 4,365,174 | 12/1982 | Kucharewski | 307/548 |
| 4,532,439 | 7/1985 | Koike | 307/450 |
| 4,571,504 | 2/1986 | Iwamoto et al. | 307/290 |
| 4,593,212 | 6/1986 | Svager | 307/279 |
| 4,638,187 | 1/1987 | Boler et al. | 307/579 |
| 4,698,526 | 10/1987 | Allan | 307/475 |
| 4,731,553 | 3/1988 | Van Lehn et al. | 307/579 |
| 4,829,199 | 5/1989 | Prater | 307/443 |
| 4,851,721 | 7/1989 | Okitaka | 307/579 |
| 4,894,560 | 1/1990 | Chung | 307/279 |

FOREIGN PATENT DOCUMENTS

| | | | |
|---|---|---|---|
| 0052595 | 4/1980 | Japan | 307/540 |
| 0067319 | 4/1982 | Japan | 307/290 |
| 0125118 | 7/1984 | Japan | 307/290 |
| 0193614 | 11/1984 | Japan | 307/290 |
| 0114024 | 6/1985 | Japan | 307/290 |
| 0090021 | 4/1987 | Japan | 307/290 |
| 0072216 | 4/1988 | Japan | 307/540 |

Primary Examiner—Stanley D. Miller
Assistant Examiner—T. Cunningham
Attorney, Agent, or Firm—Stephen J. Limanek

[57] ABSTRACT

A voltage clamping circuit is provided which includes first condutivity type and second conductivity type transistors serially arranged between first and second reference potential terminals. First control means including a first inverter are connected from the common point between the transistors to a control electrode of the first conductivity type transistor, and second control means including a second inverter are connected from the common point between the two transistors to a control electrode of the second conductivity type transistor, with the first and second inverters having different switching points.

31 Claims, 2 Drawing Sheets

VOLTAGE CLAMPING CIRCUITS WITH HIGH CURRENT CAPABILITY

DESCRIPTION

1. Technical Field

This invention relates to voltage clamping circuits and, more particularly, to voltage clamping circuits using complementary metal oxide semiconductor (CMOS) technology with high current capability.

2. Background Art

CMOS circuits are well known in the art. For example, in U.S. Pat. No. 4,532,439, filed Sept. 2, 1983, there is disclosed a logic circuit wherein the drains of serially connected P-channel and N-channel devices are connected to their gate electrodes through a crystal oscillating element providing hysteresis characteristics.

U.S. Pat. No. 4,024,418, filed Feb. 4, 1976, discloses a CMOS inverter with feedback provided between output and input in the form of two series connected oppositely poled diodes.

In U.S. Pat. No. 4,251,739, filed Sept. 20, 1977, there is disclosed a CMOS input circuit having gating circuitry adapted to receive a gating signal and a memory coupled to at least one input which is of simple construction and admits of reduced power consumption.

U.S. Pat. No. 4,571,504, filed Oct. 19, 1983, discloses a CMOS Schmitt trigger circuit having a reduced number of elements with excellent hysteresis characteristics.

A CMOS window detector circuit is disclosed in U.S. Pat. No. 3,809,926, filed Mar. 28, 1973, having two series connected P-channel and N-channel devices with their drains connected through an inverter to the control electrode of the P-channel device.

A voltage clamping circuit using N-channel MOS transistors with a dropping resistor coupled between input and output terminals is taught in U.S. Pat. No. 4,314,167, filed Oct. 11, 1979.

DISCLOSURE OF THE INVENTION

It is an object of this invention to provide simple voltage clamping circuits, preferably made in the CMOS technology, which use small devices, such as small field effect transistors, and a small area on the surface of a semiconductor substrate or chip, while having a high current capability and voltage stability and dissipating very little power, and which are particularly suitable for use in dynamic random access memories to improve yield and reliability.

In accordance with the teachings of this invention, a voltage clamping circuit is provided which includes a voltage supply source having first and second reference potential terminals and first and second serially arranged transistors coupled between the first and second reference potential terminals. First control means are connected from the common point between the transistors to a control electrode of the first transistor, and second control means are connected from the common point between the first and second transistors to a control electrode of the second transistor, with the second control means having characteristics differing from those of the first control means such that the first and second control means are actuated at different levels of control voltage.

In accordance with one preferred embodiment of this invention, the clamping circuit includes a P-channel transistor arranged serially with an N-channel transistor between first and second reference potential terminals of a voltage supply source. First and second inverters are connected from the common point between the transistors to a control electrode of the P-channel transistor such that the input of the first inverter is connected to the common point and the output of the first inverter is connected to the input of the second inverter, with the output of the second inverter being connected to the control electrode of the P-channel transistor. Third and fourth inverters are connected from the common point between the transistors to a control electrode of the N-channel transistor such that the input of the third inverter is connected to the common point and the output of the third inverter is connected to the input of the fourth inverter, with the output of the fourth inverter being connected to the control electrode of the N-channel transistor. The first and third inverters are designed so that they have different switching points.

The foregoing and other objects, features and advantages of the invention will be apparent from the following more particular description of the preferred embodiments of the invention, as illustrated in the accompanying drawings.

BEST MODE FOR CARRYING OUT THE INVENTION

Figure 1:
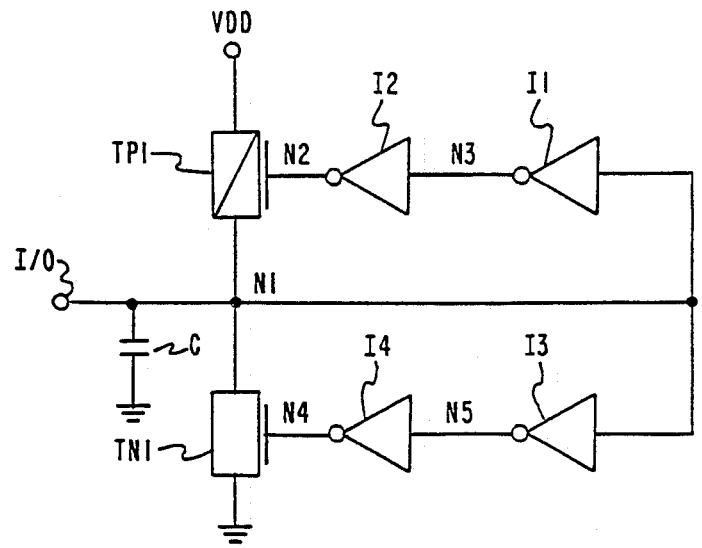
FIG. 1 is a circuit diagram of one of the preferred embodiments of a CMOS clamping circuit of the present invention.

Referring to FIG. 1 of the drawings in more detail, there is shown a circuit diagram of a preferred embodiment of the voltage clamping circuit of the present invention made in the CMOS technology. The circuit has P-channel field effect transistors indicated by a rectangle with a diagonal line formed within the rectangle and a gate electrode arranged as a line adjacent and parallel to one side of the rectangle, and N-channel field effect transistors indicated simply by a rectangle without the diagonal line and a gate electrode arranged adjacent to the rectangle.

The CMOS voltage clamping circuit of the present invention illustrated in FIG. 1 includes an input/output terminal N1 and a voltage or power supply source indicated at terminal VDD. This invention was implemented with submicron CMOS technology driven by a 3.6 v power supply. In practice, other power supplies (e.g., VDD=5 v) can be utilized. A P-channel field effect transistor TP1 is connected between the terminal VDD and the input/output terminal N1 and an N-channel field effect transistor TN1 is connected between the input/output terminal N1 and a point of reference potential such as ground. The common point between transistors TP1 and TN1 is indicated as node N1.

A first inverter I1 has an input connected to node N1 and a second inverter I2 has an output connected to a control electrode of the P-channel transistor TP1 at a node N2, with the output of the first inverter I1 being connected to an input of the second inverter I2 at a node N3. A third inverter I3 has an input also connected to node N1 and a fourth inverter I4 has an output connected to a control electrode of the N-channel transistor TN1 at a node N4, with the output of the third inverter I3 being connected to an input of the fourth inverter I4 at a node N5. Each of the inverters I1, I2, I3 and I4 are preferably known-type CMOS inverters and are designed so that the switching point of the first inverter I1 is at a significantly different switching or input voltage from that of the third inverter I3, with the switching point of the first inverter I1 being preferably at a lower voltage than that of the third inverter I3. The switching point of the second inverter I2 is preferably at substantially the same voltage as that of the first inverter I1 and the switching point of the fourth inverter I4 is preferably at substantially the same voltage as that of the third inverter I3. The clamp voltage of the circuit of FIG. 1 is taken at the input/output terminal N1 at which a parasitic capacitor C is established by various elements of this and other interconnected circuits.

Figure 2:
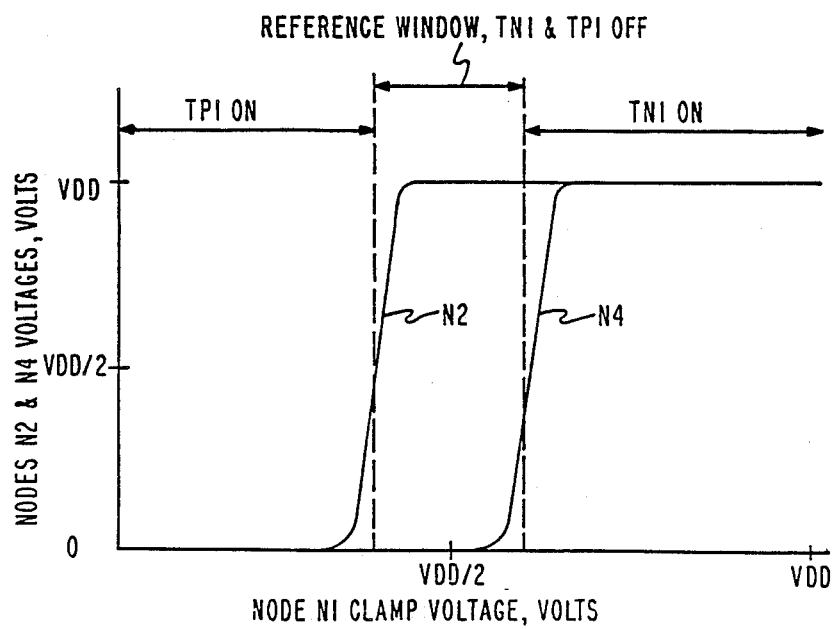
FIG. 2 is a graph indicating the transfer characteristics of the clamping circuit illustrated in FIG. 1 of the drawings.

In order to better understand the operation of the embodiment of the CMOS voltage clamping circuit of the present invention illustrated in FIG. 1, reference may be had to FIG. 2 of the drawings wherein the graph indicates the transfer characteristics of the circuit of FIG. 1. It is known that a balanced inverter switches states when the input voltage thereto reaches one half of the voltage magnitude of the voltage supply source, i.e., the voltage level VDD/2. This switching point can be shifted by, e.g., varying the width-to-length ratios of the devices or transistors of the inverters. As an example, in a CMOS inverter, increasing the width of the channel of a P-channel transistor shifts the switching point of the inverter to a higher input voltage.

In the voltage clamping circuit of FIG. 1, it is preferred to shift the switching point of the third and fourth inverters I3 and I4 to a higher voltage over that of the switching point of the first and second inverters. Thus, it can be seen that the first inverter I1 is actuated at a lower input voltage than is the third inverter I3.

Thus, the reference window, shown in FIG. 2 is established by the switching points of the first inverter I1 and the third inverter I3. It should be noted that as the switching points of the first and third inverters I1 and I3 are established closer to each other, the reference window becomes smaller. It can also be seen from the graph of FIG. 2 that when the clamp voltage at node N1 is below the reference window, the voltage on node N4 is logically low, turning the N-channel transistor TN1 off and the voltage on node N2 is also low, turning the P-channel transistor TP1 on, which pulls the clamp voltage on node N1 up toward the reference window. When the clamp voltage at node N1 is above the reference window, the voltage on node N2 is logically high, turning the P-channel transistor TP1 off and the voltage on node N4 is also high, turning N-channel transistor TN1 on, which pulls the clamp voltage on node N1 down toward the reference window. When the clamp voltage is within the reference window, the voltage on node N2 is high and the voltage on node N4 is low, turning off both transistors TP1 and TN1. Ideally the clamp voltage at node N1 should remain within the reference window between the switching points of the first and third inverters I1 and I3.

The size of the reference window depends on the voltage tolerance requirements for the operation of a circuit, such as a memory array, which is to be connected to the voltage clamping circuit at the input/output terminal N1 and, additionally, on the size of the parasitic capacitor C. Significant consideration should be given to establishing the proper reference window width. If the reference window is too narrow, the clamp circuit will not be able to respond quickly enough to changes in the clamp voltage level. Thus, the clamp voltage will tend to oscillate at voltages above and below the window without being clamped. In order to prevent such oscillations from occuring, The feedback inverters I1, I2, I3, I4 must respond to voltage changes at N1 and turn off the driving transistor TP1 or TN1, while the voltage at N1 is within the reference window. Typically, the width of a reference window of the voltage clamping circuit of this invention is a few hundred millivolts. For highly loaded circuits, a reference window of smaller size or width is possible. The size of the reference window also depends on the size of the P-channel transistor TP1 and N-channel transistor TN1, with the smaller size transistors, i.e., with a smaller width-to-length ratio of the transistor channel, responding more slowly than the larger transistors and, therefore, allowing a smaller window. For the sizes of the devices or transistors of the inverters I1, I2, I3 and I4 an opposite rule applies than that with regard to the transistors TP1 and TN1. Larger width-to-length ratios in inverters I1, I2, I3 and I4 respond quicker and a smaller reference window can be maintained without instability.

Figure 3:
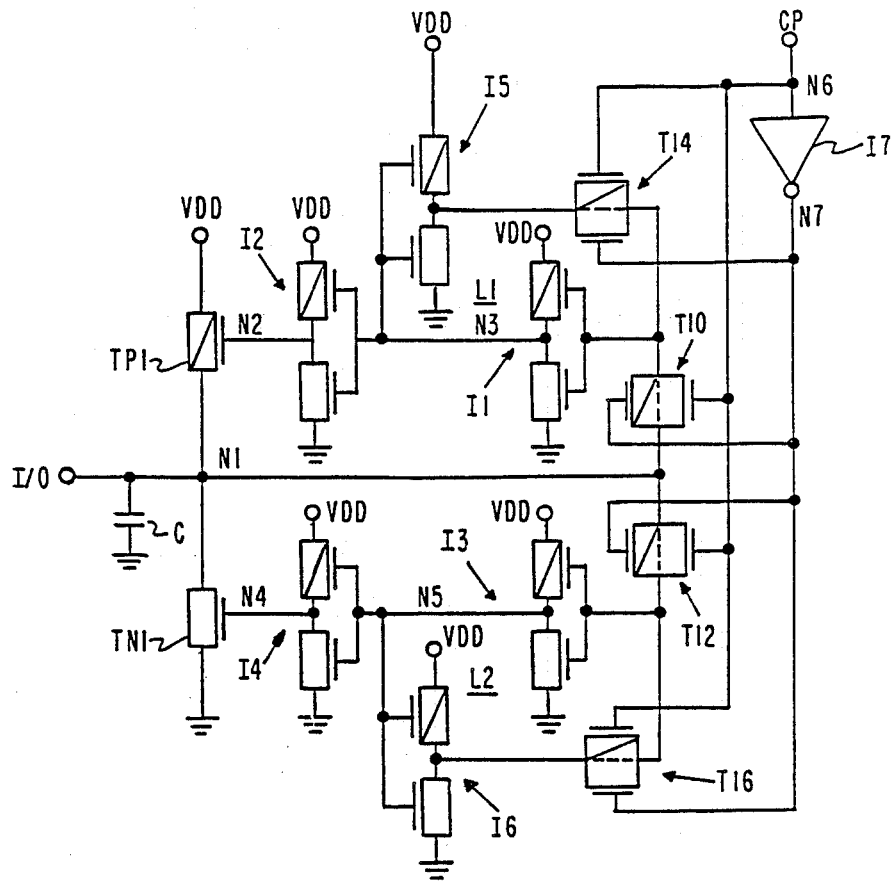
FIG. 3 is a circuit diagram of another one of the preferred embodiments of a CMOS clamping circuit of the present invention which is a modification of the circuit illustrated in FIG. 2 of the drawings.

As is known, direct current or dc power is dissipated in inverters, even inverters of the CMOS type, when they are operating near their switching point. This situation occurs in this circuit when the clamp voltage is near the reference window. In order to significantly reduce this dc power dissipation, even though this circuit uses relatively small transistors or devices, the voltage clamping circuit of FIG. 1 may be modified by adding thereto gating or sampling means and latching means, as illustrated in FIG. 3 of the drawings. It should be noted that elements in the voltage clamping circuit of FIG. 3 which are the same as or similar to the elements in the voltage clamping circuit of FIG. 1 are identified by the same reference numerals or characters. The inverters I1, I2, I3, and I4 dissipate power during the sensing portion of the clock cycle, when the clock pulse, N6, is at VDD. At this time, inverters I1 and I3 are receiving input from node N1 (through T10 and T12) and are operating near their switching points. When the clock pulse, N6, turns off, all inverters drive to full CMOS levels, VDD or GND, and power dissipation in intervers I1, I2, I3 and I4 goes to zero. The desired state of TP1 and TN1 is determined when the clock pulse is at VDD. TN1 and TP1 remain in these states until the next rising transition of the clock pulse, when they can be altered.

It can be seen in FIG. 3 that each of the inverters I1, I2, I3 and I4 of the voltage clamping circuit of the invention has been illustrated as a known-type CMOS inverter having serially arranged P-channel and N-channel field effect transistors connected between the voltage supply terminal VDD and ground. Additionally, the circuit of FIG. 3 includes a fifth inverter I5 having an input connected to node N3 or the output of the inverter I1 and a sixth inverter I6 having an input connected to node N5 or the output of the inverter I3. Each of the inverters I5 and I6 are also illustrated as CMOS inverters. A first transmission or transfer gate T10 is disposed between the node N1 and the input of the first inverter I1, a second transmission or transfer gate T12 is disposed between the node N1 and the input of the third inverter I3, a third transmission or transfer gate T14 is disposed between the output of the fifth inverter I5 and the input of the first inverter I1 and a fourth transmission or transfer gate T16 is disposed between the output of the sixth inverter I6 and the input of the third inverter I3. Each of the transmission gates T10, T12, T14 and T16 include known parallelly arranged P-channel and N-channel field effect transistors. A clock pulse terminal N6 is provided, along with a seventh inverter I7 having an input at node N6 and an output at node N7, for applying control voltages to the transmission gates T10, T12, T14 and T16. The seventh inverter I7 may also be of the CMOS type.

As can be seen, the embodiment of the voltage clamping circuit of the invention illustrated in FIG. 3 of the drawings is similar to that of the circuit illustrated in FIG. 1, but with a first modification being that the first and second transmission gates T10 and T12 are arranged so that they do not permit the voltage N1 to be applied to the inputs of the first inverter I1 and the third inverter I3, respectively, except during limited periods of time, i.e., when the clock pulse, N6, is at VDD. Also, a second modification includes the formation of first and second latches L1 and L2 which store voltages obtained from node N3 and node N5, respectively, and amplify them to full VDD or GND levels when the clock pulse N6 is at GND. The first latch L1 includes the first and fifth inverters I1 and I5 when fully interconnected by the third transmission gate T14, and the second latch L2 includes the third and sixth inverters I3 and I6 when fully interconnected by the transmission gate T16.

It should be understood that inverters I1 and I3 in the circuit of FIG. 3 must have their switching points adjusted in the same manner as those of the inverters I1 and I3 of FIG. 1 to provide the desired reference window indicated in the graph of FIG. 2 of the drawings.

The operation of the CMOS voltage clamping circuit of the present invention illustrated in FIG. 3 of the drawings is basically similar to the operation of the voltage clamping circuit illustrated in FIG. 1, except for the addition of the sampling or gating and latching features which are provided to significantly reduce the dc power dissipation in the voltage clamping circuit of the present invention. More particularly, when the clock pulse at terminal N6 is high, i.e., at a logical 1, the circuit of FIG. 3 is substantially similar both operationally and physically to the circuit of FIG. 1. With terminal N6 at a high voltage, node N6 is high and node N7 is low, consequently, transmission gates T10 and T12 are turned on and transmission gates T14 and T16 are turned off. Turning off the gates T14 and T16, disengages the latches L1 and L2, and turning on the gates T10 and T12 applies the voltage on node N1 to the inputs of the first inverter I1 and the third inverter I3, respectively. Thus, in this condition the circuit of FIG. 3 is similar to the circuit of FIG. 1. However, in order to minimize or eliminate the dc power dissipation that may be occurring in this condition due to the clamp voltage on node N1 being near the switching points of the inverters I1 and I3, the clock pulse at terminal CP is switched to a low voltage, i.e., a logical 0, to turn off transmission gates T10 and T12 and to turn on transmission gates T14 and T16. With the gates T10 and T12 being turned off, the clamp voltage on node N1 is no longer applied to the inputs of the first inverter I1 and the third inverter I3, but with the transmission gates T14 and T16 turned on the first and fifth inverters I1 and I5 are interconnected to form the latch L1 and the third and sixth inverters I3 and I6 are interconnected to form the latch L2. The state of the first latch L1 is controlled by the voltage on node N3 and the state of the second latch L2 is controlled by the voltage on node N5. The feedback from the fifth and sixth inverters I5 and I6 drives the inputs of the first and third inverters I1 and I3, respectively, to full VDD or ground voltage levels, latching the sensed voltage on nodes N3 and N5, and turning off dc current in the circuit. At this time the inverters I1, I2 and I5 and inverters I3, I4 and I6 latch in full CMOS states. Their outputs are at the full VDD voltage level or at ground. It can be seen that by periodically sampling the voltage on node N1 necessary corrections can be made and the results held in the latches L1 and L2 to minimize or eliminate the dc power dissipation.

Figure 4:
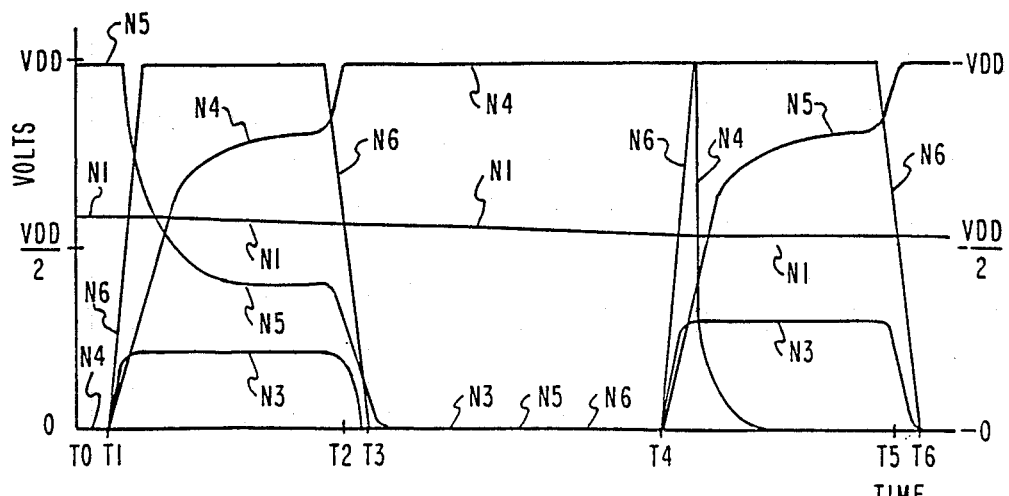
FIG. 4 is a voltage versus time graph taken at various points in the clamping circuit illustrated in FIG. 3 of the drawings.

A better understanding of a specific aspect of the operation of the circuit of FIG. 3 can be had by referring to the graph in FIG. 4 of the drawings where voltages at various points in the circuit of FIG. 3 are plotted against time. Assume that prior to time t0 the clamp voltage at the input/output terminal N1 is at the VDD/2 voltage level or at least within the reference window indicated in FIG. 2 of the drawings and, therefore, both the P-channel transistor TP1 and the N-channel transistor TN1 are turned off, node N2 being at the VDD voltage level with node N3 being at ground, and node N4 being at ground with node N5 being at the VDD voltage level. Now, at time t0 the voltage on node N1 increases to a level above the reference window for one or more reasons. As is known, such an increase, or even a decrease, can be caused by defects or leakage currents occurring in circuits connected to the voltage clamping circuit at the input/output terminal N1. With the clamp voltage on node N1 being above the VDD voltage level and outside of the reference window, at time t1 the clock pulse at the terminal CP begins to go high turning on the first and second transmission gates T10 and T12 which permits the relatively high clamp voltage on node N1 to be applied to the inputs of the first and third inverters I1 and I3, while disengaging the latches L1 and L2. The relatively high voltage on the input of the third inverter I3 tends to turn off the P-channel transistor of the inverter I3 and turn on the N-channel transistor of the inverter I3, causing the node N5 to discharge. With the node N5 discharging, the N-channel transistor of the fourth inverter I4 begins to turn off and the P-channel transistor of the fourth inverter I4 begins to turn on, causing node N4 to become charged and P-channel transistor TN1 to be turned on, which tends to discharge node N1. At time t2, the clock pulse at node N6 begins to go low, turning off transmission gates T10 and T12 and turning on transmission gates T14 and T16 to render effective the latches L1 and L2, bringing the voltage on node N4 to a full VDD level and the voltage on node N5 to ground. Since during the time between t1 and t2 the latch L1 is disengaged or not effective, the voltage on node N3 will increase somewhat without significantly altering the voltage at node N2.

During the period between times t3 and t4 the clock pulse at terminal CP, and at node N6, is at ground and, therefore, the latches L1 and L2 maintain nodes N3 and N5 at ground, causing the voltages at both nodes N2 and N4 to be high during this period. Thus, P-channel transistor TP1 continues to be turned off while the N-channel transistor TN1 is turned on hard. Consequently, the clamp voltage node N1 continues to be discharged during the period between times t3 and t4. At time t4 the clock pulse at terminal CP again begins to increase, but with the clamp voltage at node N1 now lowered to or near the VDD/2 level and applied to the input of the third inverter I3, the voltage at the input of the third inverter I3 tends to turn on the P-channel transistor of the third inverter I3 while turning off the N-channel transistor of the inverter I3. Thus, the voltage on node N5 begins to increase and the voltage on node N4 begins to decrease. At time t5 the voltage on node N6 begins to decrease to again render effective the latches L1 and L2 which cause the voltage on node N5 to increase to the full VDD level while the voltage on node N4 is at ground. During the time from t4 to t5 the voltage on node N3 increases to a value higher than the magnitude that it reached during the time from t1 to t2 since the voltage applied to the input of the inverter I1 from node N1 is now lower. At time t6, the clamp voltage at node N1 is located within the reference window at VDD/2, the voltages on nodes N3, N4 and N6 are at ground and the voltage on node N5 is the VDD level. As can be readily understood, the voltage on node N2 did not significantly change between times t0 and t6, remaining at the VDD level and, therefore, the voltage on node N2 has not been indicated in the graph of FIG. 4. Also, it should be noted that in the interest of clarity, the voltage at node N7 has not been shown in the graph of FIG. 4 since it is merely the complement of the voltage on node N6. It should be further noted that in practice more than one cycle of operation may be required to bring the clamp voltage on node N1 from a value above the reference window down to the VDD/2 level.

It can be readily seen that if the clamp voltage on node N1 had decreased at time t0 to a value below that of the reference window, the voltage on node N3 would have increased to the VDD level during the period from times t1 to t3, with the voltage on node N2 dropping to ground, and the the voltage on node N5 would have not have deviated significantly from the VDD level, with the voltage on node N4 remaining at ground. Thus, from time t1 to time t4 node N1 would have been charged up toward or to the VDD/2 voltage level through the P-channel transistor TP1 and the N-channel transistor would have remained turned off.

The width and placement of the reference window indicated in FIG. 2 of the drawings are controlled by the dimensions of the inverters I1, I2, I3 and I4 as follows: let Br, the switching point of an inverter be equal to (Wp/Lp)/(Wn/Ln), where Wp is the width of the channel of the P-channel transistor of the inverter, Lp is the length of the channel of the P-channel device of the inverter, Wn is the width of the N-channel device of the inverter and Ln is the length of the channel of the N-channel transistor of the inverter, then the more equal the Br's of the inverters I1 and I3, the narrower the reference window. Increasing or decreasing the Br's of both inverters I1 and I3 by the same amount shifts the reference window right or left, respectively.

This voltage clamping circuit is particularly useful in very high density random access memories where bit/sense lines are precharged to one half of the power supply voltage, i.e., to VDD/2. The voltage VDD/2 is obtained by shorting or connecting together equal numbers of bit/sense lines at the VDD voltage level and at ground, the bit/sense lines are shorted or connected to a common bus and, thus, defect current to any one bit/sense line affects the precharge level of all the bit/sense lines. If the precharge level shifts too far in either direction, the memory will fail. This type of voltage clamp circuit is, therefore, very important in improving memory yield and reliability.

It can be seen that the voltage clamping circuit of this invention can source or sink relatively large currents with the use of relatively small transistor or device geometries since a full voltage swing is applied to both the sourcing transistor TP1 and the sinking transistor TN1. Furthermore, it should be noted that the voltage clamping circuit of this invention has high current capability for improved performance, low dc power dissipation and high voltage stability.

While the invention has been particularly shown and described with reference to preferred embodiments thereof, it will be understood by those skilled in the art that various changes in form and details may be made therein without departing from the spirit and scope of the invention.

What is claimed is:

1. A voltage clamping circuit comprising
   a voltage source having first and second reference potential terminals,
   first and second transistors, each having a control electrode, serially connected between said first and second reference potential terminals of said voltage source,
   first control means connected from a common point between said first and second transistors to the control electrode of said first transistor, and
   second control means connected from the common point between said first and second transistors to the control electrode of said second transistor, said second control means having characteristics differing from those of said first control means such that said first and second control means are actuated at different levels of voltage applied thereto.

2. A voltage clamping circuit as set forth in claim 1 wherein said first transistor is a P-channel field effect transistor and said second transistor is an N-channel field effect transistor.

3. A voltage clamping circuit as set forth in claim 2 wherein each of said first and second control means includes an inverter.

4. A voltage clamping circuit as set forth in claim 2 wherein each of said first and second control means includes first and second inverters with the output of the first inverter is connected to the input of the second inverter.

5. A voltage clamping circuit as set forth in claim 4 wherein each of said inverters is a complementary metal oxide semiconductor (CMOS) inverter.

6. A voltage clamping circuit comprising
   a voltage source having first and second reference potential terminals,
   a given terminal,
   a first device of a given conductivity type disposed between said first reference potential terminal and said given terminal,
   a second device of a conductivity type opposite to that of said given conductivity type disposed between said second reference potential terminal and said given terminal,
   first means disposed between said given terminal and a control electrode of said first device for applying a voltage to the control electrode of said first device which is in phase with the voltage at said given terminal, and second means disposed between said given terminal and a control electrode of said second device for applying a voltage to the control electrode of said second device which is in phase with the voltage at said given terminal, said first and second means having characteristics such that actuation thereof is produced at different voltage levels.

7. A voltage clamping circuit as set forth in claim 6 wherein said first means includes a first inverter and said second means includes a second inverter.

8. A voltage clamping circuit as set forth in claim 7 wherein said first means further includes a third inverter having an input connected to the output of said first inverter and said second means further includes a fourth inverter having an input connected to the output of said second inverter.

9. A voltage clamping circuit comprising
a voltage source having first and second reference potential terminals,
an input/output terminal,
a P-channel field effect transistor connected between said first reference potential terminal and said input/output terminal,
an N-channel field effect transistor connected between said second reference potential terminal and said input/output terminal,
first and second inverters, said first inverter having an input connected to said input/output terminal and an output connected to an input of said second inverter and said second inverter having an output connected to a control electrode of said P-channel field effect transistor, and
third and fourth inverters, said third inverter having an input connected to said input/output terminal and an output connected to an input of said fourth inverter and said fourth inverter having an output connected to a control electrode of said N-channel field effect transistor, said first inverter having a switching point at a given applied voltage and said third inverter having a switching point at an applied voltage different from that of said given applied voltage.

10. A voltage clamping circuit as set forth in claim 9 wherein said second inverter has a switching point similar to that of said first inverter and said fourth inverter has a switching point similar to that of said third inverter.

11. A voltage clamping circuit as set forth in claim 9 wherein each of said inverters is a complementary metal oxide semiconductor (CMOS) inverter including serially arranged P-channel and N-channel field effect transistors.

12. A voltage clamping circuit comprising
a voltage source having first and second reference potential terminals,
an input/output terminal,
a first conductivity type transistor having a control electrode connected between said first reference potential terminal and said input/output terminal,
a second conductivity type transistor having a control electrode connected between said second reference potential terminal and said input/output terminal,
first control means having an input coupled to said input/output terminal and an output connected to the control electrode of said first conductivity type transistor, and
second control means having an input coupled to said input/output terminal and an output connected to the control electrode of said second conductivity type transistor, said first and second control means being actuated by voltages of different magnitudes at said input/output terminal.

13. A voltage clamping circuit as set forth in claim 12 wherein said first conductivity type transistor is a P-channel field effect transistor and said second conductivity type transistor is an N-channel field effect transistor.

14. A voltage clamping circuit as set forth in claim 12 wherein said first control means includes a first inverter and said second control means includes a second inverter.

15. A voltage clamping circuit as set forth in claim 14 wherein said first inverter has a switching point at a lower voltage than the switching point of said second inverter.

16. A voltage clamping circuit as set forth in claim 15 wherein said first control means further includes a third inverter, an output of said first inverter being connected to an input of said third inverter and an output of said third inverter being connected to the control electrode of said first conductivity type transistor with an input of said first inverter being connected to the input/output terminal, and said second control means further including a fourth inverter, an output of said second inverter being connected to an input of said fourth inverter and an output of said fourth inverter being connected to the control electrode of said second conductivity type transistor with an input of said second invertor being connected to the input/output terminal.

17. A voltage clamping circuit as set forth in claim 16 wherein said first conductivity type transistor is a P-channel field effect transistor and said second conductivity type transistor is an N-channel field effect transistor.

18. A voltage clamping circuit as set forth in claim 17 wherein said first and third inverters are actuated by voltages of substantially the same magnitude and said second and fourth inverters are actuated by voltages of substantially the same magnitude.

19. A voltage clamping circuit as set forth in claim 12 wherein each of said first and second control means includes latching means.

20. A voltage clamping circuit as set forth in claim 19 wherein each of said latching means includes selectively operable transmission gating means.

21. A voltage clamping circuit as set forth in claim 19 further including first selectively operable transmission gating means coupled between said input/output terminal and the input of said first control means and second selectively operable transmission gating means interposed between said input/output terminal and the input of said second control means.

22. A voltage clamping circuit as set forth in claim 21 wherein said first and second selectively operable transmission gating means include a clock pulse source.

23. A voltage clamping circuit as set forth in claim 21 wherein said latching means of said first control means includes third selectively operable transmission gating means and said latching means of said second control means includes fourth selectively operable transmission gating means, said selectively operable transmission gating means including clock pulse source means.

24. A voltage clamping circuit as set forth in claim 23 wherein said clock pulse source means turns on said first and second selectively operable transmission gating means during a first period of time and turns on said third and fourth selectively operable transmission gating means during a second period of time.

25. A voltage clamping circuit as set forth in claim 23 wherein said clock pulse source means turns on during a first period of time and turns off during a second period of time said first and second selectively operable transmission gating means and turns off during said first period of time and turns on during said second period of time said third and fourth selectively operable transmission gating means.

26. A voltage clamping circuit as set forth in claim 23 wherein each of said selectively operable transmission gating means includes a P-channel field effect transistor connected in parallel with an N-channel field effect transistor.

27. A voltage clamping circuit comprising
a voltage source having first and second reference potential terminals,
an input/output terminal,
a P-channel field effect transistor having a control electrode connected between said first reference potential terminal and said input/output terminal,
an N-channel field effect transistor having a control electrode connected between said input/output terminal and said second reference potential terminal,
a capacitor connected to said input/output terminal,
first, second and third inverters each having an input and an output, the output of said first inverter being connected to the inputs of said second and third inverters and the output of said second inverter being connected to the control electrode of said P-channel field effect transistor,
first and second transmission gates, said first transmission gate being connected between said input/output terminal and the input of said first inverter and said second transmission gate being connected between the output of said third inverter and the input of said first inverter,
fourth, fifth and sixth inverters each having an input and an output, the output of said fourth inverter being connected to the inputs of said fifth and sixth inverters and the output of said fifth inverter being connected to the control electrode of said N-channel field effect transistor, said first inverter having a switching point at a given voltage level and said fourth inverter having a switching point at a voltage level higher than that of said given voltage level,
third and fourth transmission gates, said third transmission gate being connected between said input/output terminal and the input of said fourth inverter and said fourth transmission gate being connected between the output of said sixth inverter and the input of said fourth inverter, and
clock pulse means coupled to said first, second, third and fourth transmission gates for turning on during a first period of time and turning off during a second period of time said first and third transmission gates and for turning off during the first period of time and turning on during the second period of time the second and fourth transmission gates.

28. A voltage clamping circuit as set forth in claim 27 wherein the switching point of said first inverter is at a voltage having a magnitude less than one half the difference in magnitude between said first and second reference potential terminals and the switching point of said fourth inverter is at a voltage having a magnitude greater than one half the difference in magnitude between said first and second reference potential terminals.

29. A voltage clamping circuit as set forth in claim 27 wherein each of said first, second, third, fourth, fifth and sixth inverters includes serially connected P-channel and N-channel field effect transistors.

30. A voltage clamping circuit as set forth in claim 27 wherein each of said first, second, third and fourth transmission gates includes a P-channel field effect transistor connected in parallel with an N-channel field effect transistor.

31. A voltage clamping circuit as set forth in claim 27 wherein said clock pulse means includes a seventh inverter.

* * * * *